(12) United States Patent
Houston

(10) Patent No.: US 7,894,280 B2
(45) Date of Patent: Feb. 22, 2011

(54) ASYMMETRICAL SRAM CELL WITH SEPARATE WORD LINES

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 309 days.

(21) Appl. No.: 11/931,239

(22) Filed: Oct. 31, 2007

(65) Prior Publication Data

US 2009/0109732 A1 Apr. 30, 2009

(51) Int. Cl.
*G11C 7/00* (2006.01)
(52) U.S. Cl. ............................. 365/189.14; 365/189.15; 365/189.16; 365/189.04; 365/156; 365/154
(58) Field of Classification Search ................. 365/156, 365/154, 230.05, 230.06, 189.14, 189.15, 365/189.16, 189.04
See application file for complete search history.

(56) References Cited

U.S. PATENT DOCUMENTS

| | | | | |
|---|---|---|---|---|
| 4,768,172 A | * | 8/1988 | Sasaki | 365/230.05 |
| 5,047,979 A | * | 9/1991 | Leung | 365/154 |
| 5,065,363 A | * | 11/1991 | Sato et al. | 365/154 |
| 5,774,393 A | * | 6/1998 | Kuriyama | 365/156 |
| 6,005,796 A | * | 12/1999 | Sywyk et al. | 365/156 |
| 6,363,006 B2 | * | 3/2002 | Naffziger et al. | 365/154 |
| 6,519,176 B1 | * | 2/2003 | Hamzaoglu et al. | 365/154 |
| 6,552,923 B2 | | 4/2003 | Houston | |
| 6,738,306 B2 | * | 5/2004 | McLaury | 365/230.05 |
| 6,898,111 B2 | * | 5/2005 | Yamauchi | 365/154 |
| 7,158,402 B2 | | 1/2007 | Houston | |
| 7,495,949 B2 | * | 2/2009 | Buettner et al. | 365/154 |
| 7,538,584 B2 | * | 5/2009 | Kai | 327/51 |

* cited by examiner

*Primary Examiner*—Andrew Q Tran
(74) *Attorney, Agent, or Firm*—Mima Abyad; Wade J. Brady, III; Fredrick J. Telecky, Jr.

(57) ABSTRACT

An integrated circuit includes a memory array having a plurality of SRAM memory cells arranged in a plurality of rows and columns, the array also having a plurality of word lines for accessing rows of cells and a plurality bit lines for accessing columns of cells. The plurality of memory cells include a plurality of asymmetric cells, each of the asymmetric cells configured with a strong side including a first inverter having a strong side latch node, and a strong side pass transistor coupled to the strong side latch node, and a weak side including a second inverter cross-coupled with the first inverter having a weak side latch node and a weak side pass transistor coupled to the weak side latch node. Separate ones of the plurality of word lines are coupled to a gate of the strong side pass transistor and a gate of the weak side pass transistor.

19 Claims, 3 Drawing Sheets

| | KNOWN CELL | Asym-1 | Asym-2 |
|---|---|---|---|
| DRIVER | 240/60 SVT | 90/60 HVT | 90/55 HVT |
| PASS | 120/80 SVT | 90/60 SVT | 90/55 SVT |
| LOAD | 100/60 HVT | 65/60 HVT | 65/60 HVT |
| DRIVER | | 200/60 SVT | 240/55 SVT |
| PASS | SYMMETRICAL | 160/60 SVT | 120/55 SVT |
| LOAD | | 100/60 HVT | 100/60 HVT |
| AREA: | 0.4104um² | 0.3249um² | 0.3315um² |
| Iread*: | 31.45 uA | 34.61 uA | 32.72 uA |
| SNM FOM: | 5.9 | 5.4 | 7.1 |
| Vtrip FOM: | 6.0 | 5.9/8.1 | 5.3/6.5 |

ASYMMETRICAL SRAM CELL WITH SEPARATE WORD LINES

FIELD OF INVENTION

The present invention relates generally to semiconductor memory devices and more particularly to an asymmetrical SRAM cell design that improves performance.

BACKGROUND OF THE INVENTION

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices.

Semiconductor memories can, for example, be characterized as volatile random access memories (RAMs) or nonvolatile read only memories (ROMs), where RAMs can either be static (SRAM) or dynamic (DRAM) differing mainly in the manner by which they store a state of a bit. The basic CMOS SRAM cell generally includes two n-type or n-channel (nMOS) pull-down or drive transistors and two p-type (pMOS) pull-up or load transistors in a cross-coupled inverter configuration, with two additional nMOS select or pass-gate transistors added to make up a standard double-sided or differential six-transistor memory cell (a DS 6T SRAM cell, a 6T SRAM cell, or simply a 6T cell). 5 transistor SRAM cells (5T) and 4 transistor SRAM cells (4T) are also known. Additionally, application specific SRAM cells can include an even greater number of transistors, such as 8T and 9T cells, for example, embodied as cells with read buffers or multiport cells.

FIG. 1 is schematic of a conventional differential SRAM 6T cell 100. As illustrated, the SRAM cell 100 comprises a data storage cell or latch 102, generally including a pair of cross-coupled inverters, for example, inverter 112, and inverter 114, the latch 102 operable to store a data bit state. Cell 100 also comprises a pair of wordline pass transistors 116, 118 to read and write the data bit between the cross-coupled inverters 112, 114 and bit lines BL 130, BL-bar 132, when enabled by wordline 134. Cell 100 is a symmetric cell since inverter 112 and inverter 114 are designed to be identical, as are the respective word line pass transistors 116, 118.

Respective inverters 112, 114 comprise a p-type MOS (PMOS) pull-up or load transistor Q1 120, Q2 122 and an n-type (NMOS) pull-down transistor Q3 124, Q4 126. Pass gates (e.g., transistors) Q5 116, Q6 118 are n-channel as well, which generally supply higher conductance as compared to p-channel transistors. Pass transistors 116, 118 are enabled by wordline 134 and accessed by bit lines 130, 132 to set or reset the SRAM latch 100. Inverters 112, 114 of the SRAM memory cell 100 are connected together to a Vdd drain power supply line 140 and a Vss source power supply line 150.

As dimensions are reduced to scale down devices, it becomes increasingly difficult to achieve a balance in the relative strengths (e.g. drive current capability) of the pass gate, drive, and load transistors over the desired range of temperature, bias conditions, and process variations, as well as achieving matched transistor characteristics. As a result, SRAM cells formed as such can be adversely affected by varying operating characteristics and may be unstable and may not be able to retain the desired bit state, during either or both the read or write operations. Conversely, the cell may be stable but not writeable.

Moreover, as transistor scaling trends continue, it becomes increasingly difficult to design an SRAM cell that has both adequate SNM, adequate Vtrip, and also can endure read and write operations over the desired operating range of temperature, bias conditions, and process variations. As known in the art, Vtrip is essentially a measure of the ability of a cell to be written into, and there is an interdependency between SNM and Vtrip in SRAM cell design. For example, if the pass gate is too strong relative to the drive transistor, SNM is degraded. If the pass gate is too weak relative to the load (pull-up) transistor, Vtrip is degraded. Also, if the load transistor is too weak relative to the drive transistor, SNM is degraded.

Therefore, whatever generally improves SNM, also degrades Vtrip, and vice versa. With technology scaling to the 45 nm node and beyond, it may no longer be possible to achieve a balance in the relative strengths of the pass gate, drive, and load transistors over the desired range of temperature and bias conditions as well as process variations. Thus, with the increasing random variation of transistor characteristics with scaling, it is increasingly difficult to design an SRAM cell.

Circuit designers have developed asymmetric SRAM cells (referred to herein as asymmetric conventional SRAM cells) in which one or more columns have higher threshold (or more generally lower transconductance) transistors connected to one bit line and lower threshold (or more generally higher transconductance) transistors connected to an opposing bit line. For example, transistors on a "slow" side of a given column may have a high threshold voltage and thus a lower read current but also a lower leakage to the bit line, and transistors on a "fast" side of the column may have a low threshold voltage and thus a larger read current but also a larger leakage current to the bit line. However, the conventional asymmetric SRAM cell does not help stability or ability to write. Accordingly, there is a need for an improved SRAM cell design that is compatible with technology scaling to the 45 nm node and beyond, and that largely overcomes the performance tradeoffs and provides good performance during all operating conditions for SNM, $V_{Trip}$ and $I_{Read}$, and also minimizes power and die area.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An integrated circuit comprises a memory array comprising a plurality of SRAM memory cells arranged in a plurality of rows and columns, the array also having a plurality of word lines for accessing rows of cells and a plurality bit lines for accessing columns of cells. The plurality of memory cells include a plurality of asymmetric cells, each of the asymmetric cells configured with a first strong side including a first inverter having a strong side latch node, and a strong side pass transistor coupled to the strong side latch node, and a weak side including a second inverter cross-coupled with the first inverter having a weak side latch node and a weak side pass transistor coupled to the weak side latch node. Separate ones of the plurality of word lines are coupled to a gate of the strong side pass transistor and a gate of the weak side pass transistor.

As used herein, "strong side" is defined as one side of an SRAM memory cell that provides either a greater read current as compared to the potential read current provided by the "weak side," or a greater stability as compared than the weak side. The cell asymmetry can thus be in stability and writeability, with the strong side being more stable and the weak side being more easily written, or with regard to Iread. In the case of Iread asymmetry, the Iread for the strong side is greater than the (potential) Iread for the weak side. Reference herein to a "potential Iread" for the weak side is appropriate since the weak side pass gate is generally not turned on for a read operation, and as a result, there is not an actual read current during read operations on the weak side of the asymmetric cell.

In one embodiment, an Iread for the strong side is greater than a potential Iread for the weak side. As used herein, a greater Iread refers to an Iread for the strong side at nominal conditions that is designed to be greater than the potential Iread of the weak side at nominal conditions, typically by more than 5%. Also as used herein, a greater stability for the strong side as compared to the weak side refers to a lower probability of upset of the stored state when the word line to the strong side is asserted relative to the probability of upset when the word line to the weak side is asserted, where the probability of upset is in the context of the random variation of individual transistors in an integrated circuit. As an example, under the same process, voltage and temperature conditions, 1 out of 1,000,000 cells may upset when the word line to the strong side is asserted while 1 out of 500,000 cells may upset when the word line to the weak side is asserted.

A second characteristic of the present invention is separate ones of the plurality of word lines are coupled to a gate of the strong side pass transistor and a gate of the weak side pass transistor. Thus, arrays according to the present invention include asymmetric cells with separate word lines to the strong and weak sides. Such an SRAM cell design has been found to improve the trade-offs in the design of SRAM cells including stability on READ, ability to WRITE, performance (e.g. Iread), as well as provides a reduction in both power and area.

In embodiments of the invention the cells are more stable when the strong side word line is asserted than when the weak side word line is asserted. The second inverter (weak side) can provide a higher input transition voltage as compared to the first inverter (strong side).

Embodiments of the invention include driver transistors on the strong and weak side comprising MOS transistors and the driver transistor on the weak side having at least one of a higher threshold voltage, a narrower width and a longer channel length as compared to the driver transistor on the strong side. The driver transistors can comprise n-channel-MOS transistors, wherein the strong side driver has a low Vtn relative to the weak side driver. A ratio of a strength the weak side pass transistor to a weak side driver can be greater than a ratio of the strong side pass transistor to a strong side driver. In another embodiment, the weak side pass transistor is strong relative to a weak side driver. In this embodiment, the strong side pass transistor can be strong relative to the weak side pass transistor.

The asymmetric cell can comprise a 6T cell, wherein the first and second inverters comprise p-channel load transistors and n-channel drive transistors, and the strong side and weak side pass transistors comprise n-channel transistors. In another embodiment, the asymmetric cell comprises a multi-port (e.g. dual-port) asymmetric cell.

In another embodiment, the integrated circuit further comprises read and write-back circuitry coupled between bit lines associated with the cells operable to drive bit lines of half-selected cells in a direction of a state of the cell state that existed before a write operation. In that embodiment, the integrated circuit can further comprising BL sense and BL drive circuitry operable to sense the state for the cells and to drive the bit lines to reinforce a sensed state for the half-accessed cells during the write operation. Moreover, the integrated circuit can further comprising a word line driver/controller, wherein word line drivers provided by the word line driver/controller are operable to assert a strong side word line coupled to the strong side pass transistor prior to asserting a weak side word line coupled to the weak side pass transistor during a write cycle.

The integrated circuit can further comprising a controller operable to assert a strong side word line and not assert a weak side word line for a read operation. In another embodiment, the integrated circuit further comprises a controller operable to assert a weak side word line only for a write operation. In this embodiment, the controller can be further operable to assert a strong side word line for the write operation.

A method of operating an integrated circuit comprising an asymmetric SRAM array including a plurality of asymmetric cells configured with a strong side and a weak side, wherein separate word lines are coupled to a gate of a strong side pass transistor and a gate of a weak side pass transistor, comprises the step of performing a read operation using only the strong side. The method can further comprise the step of performing a write operation using both the strong side and weak side. In this embodiment, the method can further comprise the step of performing the write operation using interleaved words. The method can further comprise the step of performing a read-and-write-back operation to restore data to the cells that are in unselected columns of the array during the write operation.

The method can further comprise the step of adding a delay between a read/write word line on the strong side going high and a write-only word line on the weak side going high. In this embodiment, the read-and-write back step can be completed during an interval of time required for driving respective one of the bit lines in the write operation.

DETAILED DESCRIPTION

Figure 1:
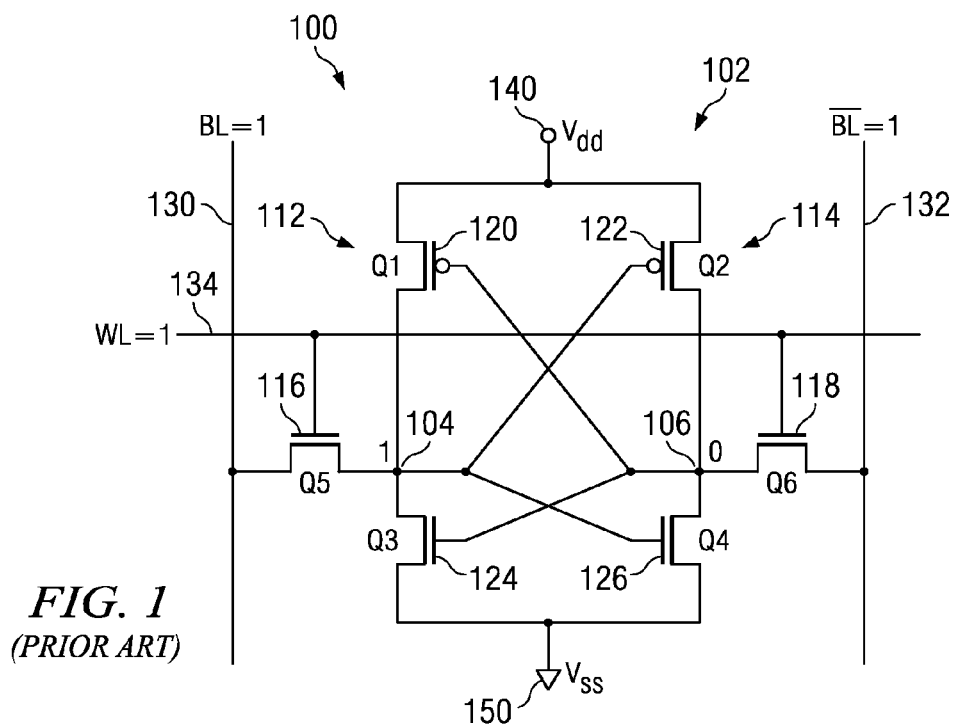
FIG. 1 is a schematic diagram of a conventional differential 6T static random access memory (SRAM) cell.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts can occur in different orders and/or concurrently with other acts or events. Furthermore, not all illustrated acts or events are required to implement a methodology in accordance with the present invention.

Figure 2:
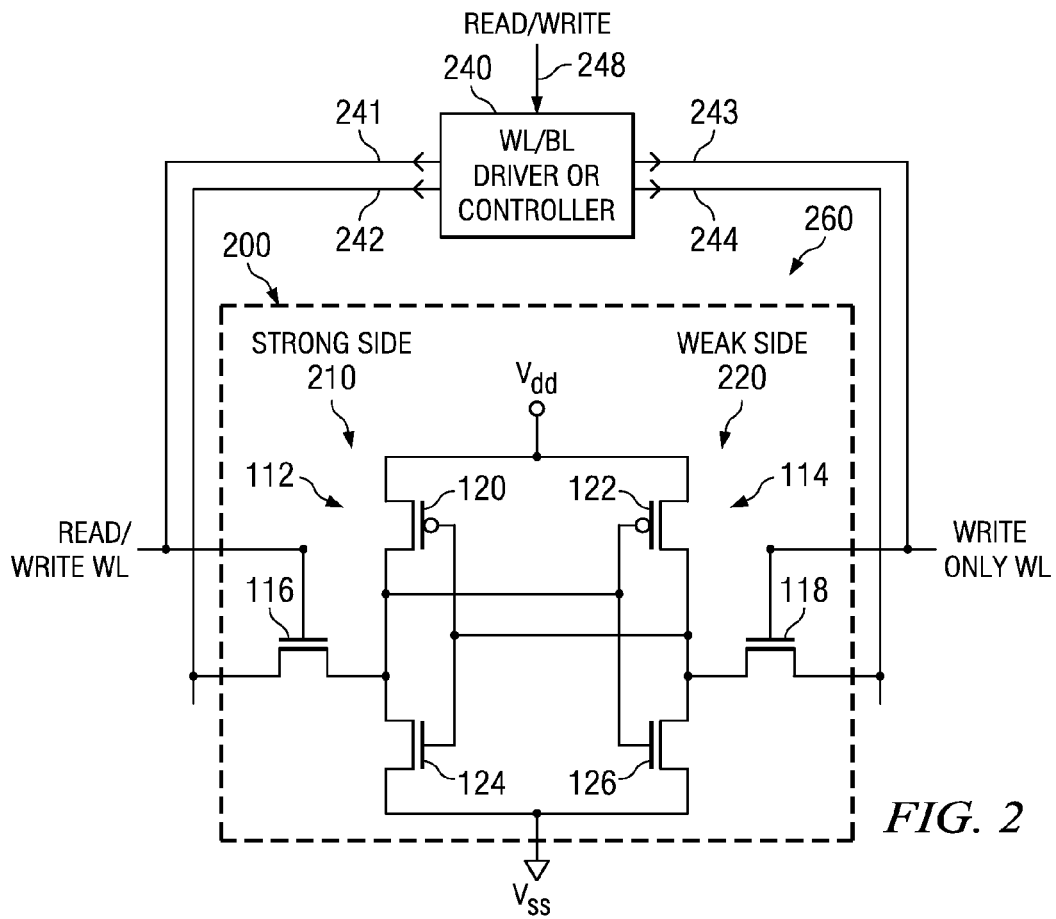
FIG. 2 is an exemplary asymmetric 6T SRAM cell according to an embodiment of the present invention that permits read operations from only one side (the strong side) of the cell.

FIG. 2 is an exemplary asymmetric 6T SRAM cell 200 according to an embodiment of the present invention that permits read operations from only one side of the cell. Array 260 represents a plurality of cells 200. Cell 200 includes strong side 210 comprising an inverter 112 and associated strong side pass gate 116 and weak side 220 comprising an inverter 114 and associated weak side pass gate 118. Asymmetric cell 200 will generally be described as having an Iread provided by the strong side that is greater than the potential Iread for the weak side. However, as noted above, asymmetrical cells according to an embodiment of the present invention can be based instead on stability and writeability, with the strong side being more stable and the weak side being more easily written.

In cell 200 there are separate word lines 241 and 243 for controlling the pass gate 116 for the strong side and pass gate 118 for the weak side, respectively, that enable read operations from only one side (the strong side 210) of the cell 200, and write operations from both sides (210 and 220) of the cell 200. Optionally, the write operation may be done from only the weak side.

An integrated circuit comprising a memory array comprises a plurality of asymmetric SRAM cells according to the present invention. In one embodiment of the invention the array has alternating orientations of asymmetric cells. Mixing of symmetric and asymmetric cells in a single array is also included in another embodiment of the invention.

Cell 200 is shown as a typical SRAM cell comprising a six-transistor cell including two p-channel "pull-up" or "load" transistors, two n-channel "pull-down" or "driver" transistors and two n-channel pass transistors. The strength of the p-doped and n-doped channels of the transistors is known to affect the performance, including SNM and Vtrip of the SRAM memory cells as a whole.

Strong side 210 thus may provide one or more of wider transistor(s), lower threshold voltages (Vt's) and shorter channel lengths as compared to weak side 220, as well as different W/L ratios among driver, pass, and load transistors so that strong side 210 provides a higher Iread as compared to weak side 220. Of course, there are other means for differentiating opposing sides of the asymmetric memory cells 200 within the scope of the present invention, in addition to or in cooperation with the exemplary means described above. As used herein, a "relatively strong" transistor is designed to have a higher transconductance or a lower magnitude threshold voltage compared to a "relatively weak" transistor, typically by more than 5%. With random variation, a weak "relatively strong" transistor may be weaker than a strong "relatively weak" transistor. That is, the spread in transistor strengths due to local variation may be greater than the difference between the nominal values of "relatively strong" and "relatively weak" transistors.

Word line (WL) and bit line (BL) select driver or controller 240 (hereafter controller 240) controls read/write WL 241, read/write BL 242, write-only WL 243 and write-only BL-bar 244, with the respective WLs and BLs associated with a plurality of cells comprising array 206, including cell 200. Controller 240 receives indications of the read and write operation, for example, which may be supplied by a high and low state on a read/write input 248. In response to the indication of a read operation, controller 240 is operable to activate read/write WL 241 and read/write BL 242 to accomplish reading of cell 200 using only strong side 210. In response to the indication of a write operation, controller 240 is operable to activate read/write WL 241, read/write BL 242, write-only WL 243, and write-only BL-bar 244 to accomplish writing of cell 200 using both strong side 210 and weak side 220. Optionally, in response to the indication of a write operation, controller 240 may be operable to activate write-only WL 243, and write-only BL-bar 244 to accomplish writing of cell 200 using only weak side 220. Although shown as a single controller 240, the respective WLs 241 and 243 and BLs 242 and 244 may be controlled using separate controllers/drivers.

Cell 200 provides several salient distinctions as compared to known asymmetric SRAM cells. One clear distinction is having separate word lines 241 and 243 for the respective sides 210 and 220 of the asymmetrical cell 200 according to an embodiment of the present invention. Separate word lines 241 and 243 permit turning on only the strong side, but not the weak side, in read, and in the read portion of read and write-back in a write cycle. Separate word lines 241 and 243 also permit turning on only the weak side, but not the strong side, or turning on both the strong side and the weak side in a write cycle. If a write cycle includes a read and write-back, separate word lines 241 and 243 permit turning on only the strong side in the read portion and only the weak side, optionally with overlap, or both the strong side and the weak side in the write portion. Turning on only the weak side in a write cycle, or only the weak side in the write portion of a write cycle can reduce active power with the possible trade-off of a less robust write. Thus, the separate word lines for the strong and weak sides allows improved performance of cells according to the invention for both SNM and Vtrip.

In conventional DRAM, the read operation is destructive and it is necessary to write back into the cell after a read. In the asymmetrical SRAM cell, the cell is generally stable in a read operation, but the unaddressed cells in an addressed row (hereafter referred to as half-addressed cells) may be upset during the write operation. In embodiments of the invention, to avoid, or at least significantly reduce, the chance of an upset, half addressed cells can be "read" in the first half of a write cycle and then the state "written back" into these half-addressed cells in the second half of the write cycle along with the input data being written into the addressed cells. Read and write-back is described in more detail relative to FIGS. 3A and 3B.

For the read operations, since the weak side word line 243 is separate from the strong side word line 241, although the strong side pass gate 116 is turned on, the weak side pass gate 118 is not turned on. If the weak side 220 is the low storage node, in normal operation with BL precharged high, it will not be pulled up during read, and the cell is very stable, even with a low Vtn driver transistor 124 on the strong side 210.

The strong side pass gate 116 is turned on by the strong side word line 241. If the strong side is the low storage node, it will get pulled by the BL voltage applied by Read/Write BL 242 divided down by the voltage divider formed between the pass gate 116 and the strong side driver 124. In one embodiment of the invention, the inverter 114 on the weak side 220 is designed to have a high input transition voltage (e.g. relatively weak driver/high Vtn), allowing for a relatively large rise in the strong side low without the weak side 220 high going low. Thus, cells according to the invention such as cell 200 can provide stability without sacrificing Iread performance.

In one embodiment of the present invention, for improving Iread without degrading SNM, the strong side driver 124 can have low Vtn or otherwise have a stronger Idrive relative to the strong side load transistor 120 than would be allowed for stability if the opposite side pass gate 118 were turned on. Moreover, in this embodiment, to improve cell stability, the weak side driver 126 can be made relatively weak (e.g. a high Vt or narrow width or longer channel length L) relative to the weak side load 122 and pass gate 118, thus raising the input transition voltage of the weak side inverter 114 for an output high-to-low transition. In the preceding, having the weak side driver 126 relatively weak relative to the weak side load 122 and pass gate 118 is in comparison to the ratios in the strong side or in comparison to the ratios of driver to load and pass gate in prior art symmetrical cells. That is, the weak side driver 126 may still be stronger than the weak side load 122, but by less than in the strong side or in prior art symmetrical cells. Raising this transition voltage allows the strong side pass transistor 116 to be stronger relative to the strong side drive transistor 124 than otherwise, further allowing a stronger Iread. Having the weak side driver 126 relatively weak does not generally compromise Iread for cell 200 because as described above reading is only from the strong side 210 as provided by the asymmetric read and write word lines associated with cell 200.

In another embodiment of the present invention, for write operations, the weak side pass gate 118 can be made stronger relative to the weak side driver 126 than would be generally allowed for stability if the weak side pass gate 118 were turned on for a read operation. With the restriction removed for keeping the weak side pass gate 118 weak relative to the weak side driver 126, the weak side pass gate 118 can be made stronger relative to the weak side load 122 to provide a more robust write operation. In one embodiment, the weak side pass gate is sufficiently strong relative to the weak side driver to allow a write to be accomplished only using the weak side. The strong side pass gate 116 can be made stronger relative to the strong side driver 124 than would be allowed for stability in a conventional symmetric cell since the weak side inverter 114 can be designed with a high input transition voltage. Allowing the strong side pass gate 116 to be stronger relative to the strong side driver 124 facilitates making the strong side pass gate 116 stronger relative to the strong side load 120 for a robust write operation.

Moreover, the strong side load 120 can be made relatively weak to improve write, since a weak side low will generally not be pulled up during a read operation of cell 200. Thus a write can be made robust in a write cycle with both the strong side word line 241 and the weak side word line 243 asserted in the write portion of the write cycle. In one embodiment, the write is sufficiently robust with only the weak side word line 243 asserted in the write portion of the write cycle, for example, if the weak side pass gate is sufficiently strong relative to the weak side driver. Optionally, the weak side word line 243 may be boosted above VDD when asserted to improve the robustness of the write.

Integrated circuits comprising memory arrays according to embodiments of the present invention generally support the use of interleaved words, where there are half addressed cells in the unaddressed columns in a selected row of a memory array. For write, in the case of use of interleaved words, there is the possibility of upset of the half-addressed cells since the WL 243 is asserted for the row, turning on the pass gates 118. To avoid, or at least significantly reduce the incidence of this potential problem, for the unselected columns in write, in one embodiment of the invention a read-and-write-back operation can be performed wherein the bit lines of the half-selected cells are driven in the direction of the cell state that existed before the write operation, effectively eliminating the possibility of upset. Here, "read" and "written back" as used herein means that the data state of the half-addressed cells are sensed such that the voltage on the associated bit lines can be set such that the half-addressed cells will not be upset when the write occurs. The voltages applied to the bit lines of the half addressed cells in this "write-back" need to be set only to avoid upset of the half addressed cells which may be less of a constraint than to set the voltages for a robust write. It is noted that if the array architecture has no half-addressed cells, (e.g. that input data is provided for all cells in an addressed row), then read and write-back is not needed in the write cycle even though the cell may be unstable with the write WL asserted.

In one embodiment, the read-and-write back operation can be facilitated by having a delay between the read/write WL 241 on the strong side 210 going high and the write-only WL 243 on the weak side going high. The delay to implement read-and-write back can generally be contemporaneous with and thus "hidden" during the interval of time typically required for driving the BLs 242 and 244 in write.

Figure 3A:
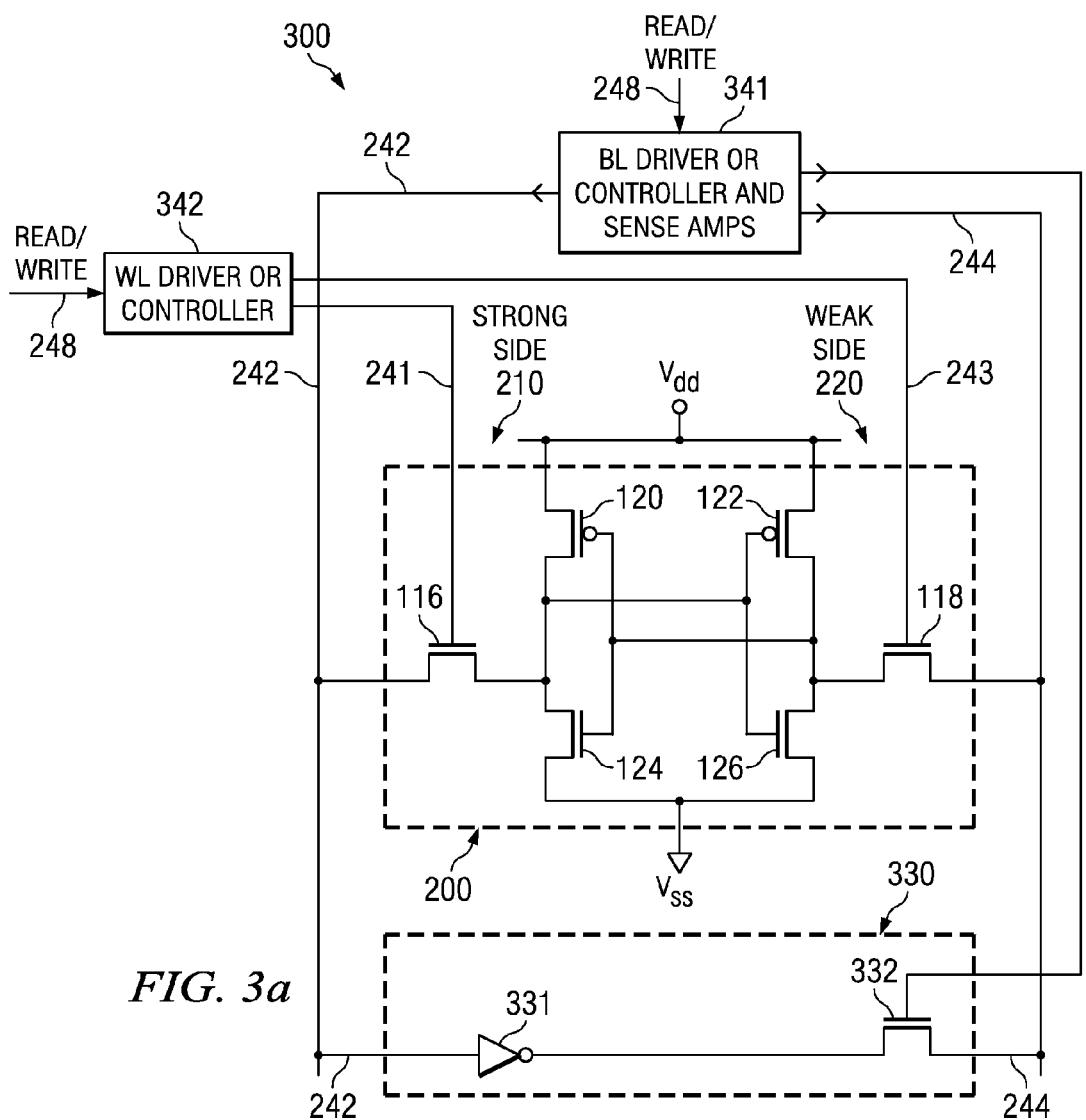
FIG. 3A depicts an exemplary asymmetric 6T SRAM cell having read and write-back circuitry for half-addressed cells during a write operation subject to upset during write, according to an embodiment of the present invention.

FIG. 3A depicts an exemplary asymmetric 6T SRAM cell 300 according to an embodiment of the invention having read and write-back circuitry for half-addressed cells during a write operation subject to upset. Cell 300 shown comprises cell 200 shown in FIG. 2 along with read and write-back circuitry 330 coupled between the Read/Write BL 242 and Write only BL-bar 244. Read and Write-back circuitry 330 shown in FIG. 3A comprises an inverter 331 in series with a switch 332 which receives has its control input (gate) coupled to receive half-select write signal 245 provided by BL driver or controller and sense amp circuitry 341 (hereafter controller and sense amps 341). WLs 241 and 243 are controlled by WL controller or driver 342 (hereafter WL controller 342). Both BL controller and sense amps 341 and WL controller 342 are shown receiving read/write input signal 248. In the embodiment of FIG. 3A, inverter 331 and pass gate 332 serve as bit line sense and bit line drive circuitry to sense the state of the cell 200 and to drive the bit lines 244 to reinforce the sensed state for half-accessed cells during a write operation. Those having ordinary skill in the art will recognize that other circuitry may be used for this function.

Figure 3B:
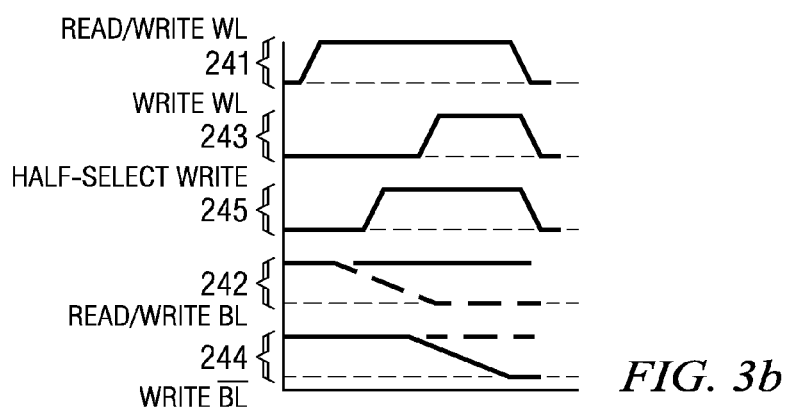
FIG. 3B provides exemplary dynamic levels for the various word lines and bit lines during a read and write-back cycle for the exemplary asymmetric 6T SRAM cell shown in FIG. 3A.

FIG. 3B provides exemplary dynamic levels for the various WLs and BLs during a read and write-back cycle, including half-select write 245 provided by exemplary asymmetric 6T SRAM cell 300 shown in FIG. 3A. A time delay is shown between the read/write WL 241 on the strong side 210 going high and the write-only WL 243 on the weak side going high. The solid line shown is for a bit storing a '1' (strong side 210 of cell 300 high), while the dashed line is shown for a bit storing a '0' (strong side 210 of cell 300 low). The delay to implement read-and-write back is shown being hidden within the interval of time for driving the BLs 242 and 244 in write. For options with only the weak side word line 243 asserted in the write portion of the write cycle, the strong side word line 241 may go low at about the same time as the weak side word line 243 goes high. For an embodiment that does not include read and write-back in the write cycle, for example where there is no interleaving of words in a row, optionally the strong side word line 241 is not asserted in the write cycle.

Figures 4, 5:
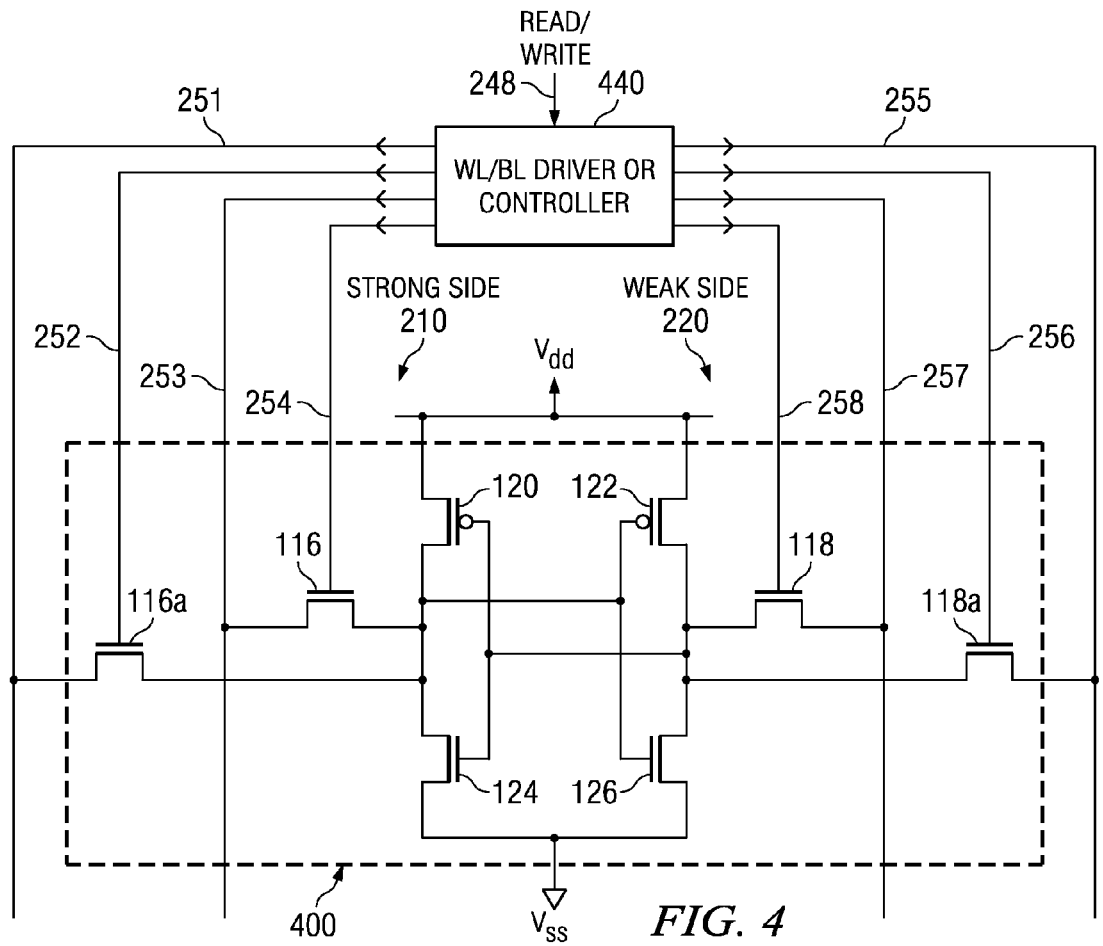
FIG. 4 is an exemplary asymmetric dual-port SRAM cell according to another embodiment of the present invention that permits read operations from only one side of the cell and more than one system device to directly access the memory.
FIG. 5 lists simulation results obtained for a first and second exemplary asymmetrical 6T cell according to the present invention, as compared to a symmetrical otherwise generally equivalent known symmetrical cell.

FIG. 4 is an exemplary asymmetric dual-port SRAM cell 400 according to another embodiment of the present invention that permits read operations from only one side of the cell. As known in the art, system access speed can often be significantly increased through the use of a dual port memory architecture. A dual port memory has two access ports (two pass transistors connected in parallel) so that more than one system device may directly access the memory in a controlled fashion.

Like cell 200 shown in FIG. 2, asymmetric dual-port cell 400 includes strong side 210 comprising an inverter 112 and associated pass gate 116 and weak side 220 comprising an inverter 114 and associated pass gate 118. The Iread provided by the strong side is greater than the potential Iread for the weak side. In contrast to cell 200 which has a single pass gate for both the strong and weak side, in cell 300 there are two pass gates (116, 116(*a*)) for the strong side 210 and two pass gates (118, 118(*a*)) for the weak side 220, termed port-1 and port-2, respectively. Those having ordinary skill in the art will recognize that other combinations of ports, such as two read ports and one write port can be supported with this asymmetrical design.

The separate pass gates on both strong and weak side receive separate WL and BL drive signals from WLIBL controller or driver 440 (hereafter WLIBL controller 440, that enables read operations from only the strong side 210, and write operations from both sides (210 and 220) of cell 400. Specifically, signals from WL/BL controller 440 coupled to strong side 210 include Port-2 Read/Write BL 251, Port-2 Read/Write WL 252 coupled to pass transistor 116(*a*) and Port-1 Read/Write BL 253, Port-1 Read/Write WL 254 coupled to pass transistor 116. Signals from WLIBL controller coupled to weak side 220 include Port-2 Write BL-bar 255, Port-2 Write WL 256 coupled to pass transistor 118(*a*) and Port-1 Write BL-bar 257 and Port-1 Write WL 258 coupled to pass transistor 118.

Besides asymmetry, asymmetric dual port cell 400 is distinct from a conventional symmetrical dual port cell which in contrast uses a common Port-2 WL and BL for both Port-2 transistors (116(*a*) and 118(*a*) in FIG. 3), and a common Port-I WL and BL for both Port-1 transistors (116 and 118 in FIG. 3).

EXAMPLES

It should be understood that the Example described below is provided for illustrative purposes only and does not in any way define the scope of the invention.

FIG. 5 lists simulation results for a total power supply voltage of 0.99V for a first and second asymmetrical 6T cell according to an embodiment of the invention including two p-channel pull-up transistors, two n-channel pull-down transistors and two n-channel pass transistors, as compared to a symmetrical otherwise equivalent known symmetrical 6T cell, except as noted in FIG. 5. SNM and Vtrip were simulated at worst case conditions (−40 C for Vtrip; 125 C for SNM). Iread was simulated with the target model parameters at 125 C. FOM stands for figure of merit, which provides a measure of tolerance to process and random variation where a larger FOM indicates greater margin and a FOM>5 is generally required for acceptable yield.

The dimension of the respective transistors are shown in W/L form in FIG. 5. HVT stands for high Vt and SVT stands for standard Vt. The SVT used for the simulation was −0.33V for the pMOS loads and 0.4V for the nMOS driver and pass transistors. HVT is defined and was simulated at a threshold typically at least 20 mV above SVT. (In this case, HVTn is 0.48V and HVTp is −0.44V. Although not simulated, LVT transistors could have been used to provide strong transistors, defined typically as a threshold of at least 20 mV volts less than SVT. For example, in the technology simulated, LVTn=0.33V and LVTp=−0.3V.

Asymmetric cells according to the present invention can be seen to provide a significantly smaller area based primarily on the area savings provided by having a weak side in the cell. In contrast, the known conventional cell has no weak side because it is a symmetrical cell. Iread is also higher for asymmetric cells according to the present invention, including over 10% in the case of Asym-1 vs. the known conventional cell. The target FOM>5 can be seen to be provided by all cells simulated for both SNM and Vtrip. It is noted that asymmetrical Vtrip FOM was calculated for write-1/write-0. Since the asymmetric SNM FOM is infinite in one direction (strong side high.), the SNM FOM is calculated only for the strong-side-low case.

Although an SRAM cell has been discussed in accordance with the arrays and method of the present invention, it is appreciated by the present Inventor that cell and transistor technology variations, including, but not limited to, array, bitline, or wordline orientation variations are included in the context of the present invention.

The invention is also not limited to the use of silicon wafers, and may be implemented in association with the manufacture of various semiconductor devices, SRAM memory devices, or other such devices, wherein the design and optimization of an SRAM cell, potential data upsets, and power consumption is an issue, where cell access is to be limited only to the memory area being used, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

I claim:

1. An integrated circuit, comprising:
    a memory array comprising a plurality of SRAM memory cells arranged in a plurality of rows and columns, said array also having a plurality of word lines for accessing rows of cells and a plurality of bit lines for accessing columns of cells;
    said plurality of memory cells including a plurality of asymmetric cells, each of said asymmetric cells configured with a strong side including a first inverter having a strong side latch node, and a strong side pass transistor coupled to said strong side latch node, and a weak side including a second inverter cross-coupled with said first inverter having a weak side latch node and a weak side pass transistor coupled to said weak side latch node, wherein said plurality of word lines are coupled to at least one of a gate of said strong side pass transistor and a gate of said weak side pass transistor; and a read and write-back circuitry coupled between bit lines associated with said cells.

2. The integrated circuit of claim 1, wherein an Iread for said strong side is greater than a potential Iread for said weak side.

3. The integrated circuit of claim 1, wherein said cells are more stable when the strong side word line is asserted than when the weak side word line is asserted.

4. The integrated circuit of claim 1, wherein said second inverter provides a higher input transition voltage as compared to said first inverter.

5. The integrated circuit of claim 1, wherein driver transistors on said strong and said weak side comprise MOS transistors and said driver transistor on said weak side has at least one of a higher threshold voltage, a narrower width and a longer channel length as compared to said driver transistor on said strong side.

6. The integrated circuit of claim 5, wherein said driver transistors comprise n-channel-MOS transistors, wherein said strong side driver has a low Vtn relative to said weak side driver.

7. The integrated circuit of claim 1, wherein a ratio of a strength of said weak side pass transistor to a weak side driver is greater than a ratio of said strong side pass transistor to a strong side driver.

8. The integrated circuit of claim 1, wherein said weak side pass transistor is strong relative to a weak side driver.

9. The integrated circuit of claim 8, wherein said strong side pass transistor is strong relative to said weak side pass transistor.

10. The integrated circuit of claim 1, wherein said asymmetric cells comprise 6T cells, wherein said first and second inverters comprise p-channel load transistors and n-channel drive transistors, and said strong side and said weak side pass transistors comprise n-channel transistors.

11. The integrated circuit of claim 1, wherein said asymmetric cells comprise multi-port cells.

12. The integrated circuit of claim 1, wherein the read and write-back circuitry coupled between bit lines associated with said cells operable to drive bit lines of half-selected cells in a direction of the state of said cell state that existed before a write operation.

13. The integrated circuit of claim 12, further comprising BL sense and BL drive circuitry operable to sense the state for said cells and to drive said bit lines to reinforce a sensed state for said half-accessed cells during said write operation.

14. The integrated circuit of claim 12, further comprising a word line driver/controller, wherein word line drivers provided by said word line driver/controller are operable to assert a strong side word line coupled to said strong side pass transistor prior to asserting a weak side word line coupled to said weak side pass transistor during a write cycle.

15. The integrated circuit of claim 1, further comprising a controller operable to assert a strong side word line and not assert a weak side word line for a read operation.

16. The integrated circuit of claim 1, further comprising a controller operable to assert a weak side word line only for a write operation.

17. The integrated circuit of claim 16, wherein said controller is further operable to assert a strong side word line for said write operation.

18. An integrated circuit, comprising:
a memory array comprising a plurality of SRAM memory cells arranged in a plurality of rows and columns, said array also having a plurality of word lines for accessing rows of cells and a plurality of bit lines for accessing columns of cells;
said plurality of memory cells including a plurality of asymmetric cells comprising at least six transistors per cell, each of said asymmetric cells configured with a strong side including a first inverter having a strong side latch node and a strong side pass transistor coupled to said strong side latch node, and a weak side including a second inverter cross-coupled with said first inverter having a weak side latch node and a weak side pass transistor coupled to said weak side latch node, wherein said first and second inverters comprise p-channel load transistors and n-channel drive transistors and said strong side and said weak side pass transistors comprise n-channel transistors and a read and write-back circuitry coupled between bit lines associated with said cells; and
wherein an Iread for said strong side is greater than a potential Iread for said weak side and separate ones of said plurality of word lines are coupled to at least one of a gate of said strong side pass transistor and a gate of said weak side pass transistor.

19. The integrated circuit of claim 18, wherein at least a portion of said asymmetric cells comprise multi-port cells.

* * * * *